United States Patent
Auriel et al.

(10) Patent No.: US 6,551,868 B1
(45) Date of Patent: Apr. 22, 2003

(54) VERTICAL POWER COMPONENT MANUFACTURING METHOD

(75) Inventors: Gérard Auriel, Tours (FR); Laurent Cornibert, Tours (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/705,292

(22) Filed: Nov. 2, 2000

(30) Foreign Application Priority Data

Nov. 3, 1999 (FR) .............................................. 99 14012

(51) Int. Cl.$^7$ ............................................. H01L 21/337
(52) U.S. Cl. ........................ 438/192; 438/221; 438/294
(58) Field of Search ................................. 438/192, 295, 438/294, 355, 413, 400, 430, 424, 221

(56) References Cited

U.S. PATENT DOCUMENTS

| | | | |
|---|---|---|---|
| 4,829,017 A | * 5/1989 | Malhi .......................... | 257/302 |
| 4,889,492 A | * 12/1989 | Barden et al. ............... | 438/247 |
| 5,049,521 A | 9/1991 | Belanger et al. .............. | 437/62 |
| 5,497,026 A | 3/1996 | Vogelzang .................... | 257/487 |
| 5,688,702 A | * 11/1997 | Nakagawa et al. ......... | 438/234 |
| 5,998,822 A | * 12/1999 | Wada ........................... | 257/296 |
| 2001/0011717 A1 | * 8/2001 | Mathieu ..................... | 252/500 |
| 2002/0014678 A1 | * 2/2002 | Erratico ...................... | 257/510 |

FOREIGN PATENT DOCUMENTS

| | | | |
|---|---|---|---|
| EP | A-0 236 811 | 9/1987 | ........... H01L/29/70 |
| EP | A-0 597 266 | 5/1994 | ........... H01L/21/76 |
| FR | A-2 675 310 | 10/1992 | ........... H01L/21/76 |

OTHER PUBLICATIONS

French Search Report from French Patent Application 99 14012, filed Nov. 3, 1999.

Patent Abstracts of Japan, vol. 006, No. 077 (E–106), May 14, 1982 & JP 57 017145 A (Fujitsu Ltd.).

* cited by examiner

*Primary Examiner*—Vu A. Le
*Assistant Examiner*—Brad Smith
(74) *Attorney, Agent, or Firm*—Wolf, Greenfield & Sacks, P.C.; James H. Morris

(57) ABSTRACT

A method for manufacturing a vertical power component on a silicon wafer, including the steps of growing a lightly-doped epitaxial layer of a second conductivity type on the upper surface of a heavily-doped substrate of a first conductivity type, the epitaxial layer having a thickness adapted to withstanding the maximum voltage likely to be applied to the power component during its operation; and delimiting in the wafer an area corresponding to at least one power component by an isolating wall formed by etching a trench through the epitaxial layer and diffusing from this trench a dopant of the first conductivity type of high doping level.

4 Claims, 1 Drawing Sheet

VERTICAL POWER COMPONENT MANUFACTURING METHOD

BACKGROUND OF THE INVENTION

1. Field of the Invention

The present invention relates to power components of vertical type capable of withstanding high voltages.

2. Discussion of the Related Art

FIG. 1 is a very simplified cross-section view illustrating the general structure of a conventional power component. This component is formed in a large silicon wafer and is surrounded at its external periphery with an isolating wall of a conductivity type opposite to that of the substrate. This isolating wall is intended to separate the component from other components on the same chip, or for creating an electrically inactive protection area at the border of a chip, where a cutting is performed with respect to a neighboring chip. More specifically, referring to FIG. 1, starting from an N-type substrate, a first manufacturing operation consists of forming from, the upper and lower surfaces of this substrate, deep diffusion regions 2 and 3 that join to form the isolating wall.

For practical reasons, the wafers cannot have thicknesses under 200 $\mu$m. Under this threshold, they would be likely to break too easily in handling associated with the manufacturing process. Thus, each of deep diffusions 2 and 3 must penetrate into the wafer by some hundred $\mu$m, for example, 125 $\mu$m for a wafer of a thickness from 210 to 240 $\mu$m, to ascertain that a continuous wall, sufficiently doped at the level of its median portion, is formed. This requires very long diffusions at high temperatures, for example 300 hours at 1280° C. Clearly, this operation must be performed on a silicon wafer before any other wafer doping operation. Otherwise, during this long thermal processing time, the implantations previously performed in the substrate would diffuse too deeply.

After forming the isolating walls, doped regions intended to form the desired vertical component, for example, as shown in FIG. 1, a thyristor, are formed. For this purpose, a P-type region 4 corresponding to the thyristor anode may be formed on the entire lower substrate surface, simultaneously to a P-type region 5 corresponding to the cathode gate region of this thyristor, on a portion of the upper substrate surface. Then, on the upper surface side, an N$^+$ diffusion is performed to form in region 5 a cathode region 6 and possibly, between region 5 and isolating wall 2, a peripheral channel stop ring 7.

As seen previously, the total thickness of the wafer is determined by manufacturing considerations, which are essentially mechanical. Further, the characteristics of P-type regions 4 and 5 are determined by the desired electric characteristics of the thyristor, which determine the doping level and the diffusion depth. Indeed, it is, for example, desired to have a sufficiently steep doping front between each of regions 4 and 5 and substrate 1 to improve the characteristics of the corresponding junctions, and especially to obtain a good injection characteristic of the PNP transistor at the level of the junction between substrate 1 and region 4.

Thus, in the case of the shown thyristor, if each of diffusions 4 and 5 has a depth on the order of 40 $\mu$m, and if the wafer has a 210-$\mu$m thickness, there will remain between P-N junctions 5-1 and 4-1 an area of substrate 1 having a 130-$\mu$m thickness. As is well known, this area of the substrate provides the off-state breakdown voltage characteristics to the power device. This area must thus be sufficiently thick. However, an excessive thickness of this area results in an increase of on-state losses of the power device. If a power device having a breakdown voltage on the order of 400 volts is desired to be obtained, it would be sufficient for the thickness of the region of substrate 1 to be on the order of 80 $\mu$m whereas, with the described manufacturing method, a thickness on the order of 130 $\mu$m is inevitably provided. No simple way of solving this problem is currently known. Indeed, increasing, for example, the thickness of layer 4 has the consequence that the junction profile of this layer risks not fulfilling the desired electric conditions.

More generally, the same problem is raised with any power device to be surrounded with an isolating wall, the rear surface of which is of a doping type opposite to that of a breakdown voltage substrate, for example a power transistor or an IGBT transistor.

SUMMARY OF THE INVENTION

Thus, an object of the present invention is to provide a novel method of manufacturing power components intended for or optimize the thickness of the most lightly doped breakdown voltage layer.

The present invention also aims at a component obtained by the described method.

To achieve these and other objects, the present invention provides a method for manufacturing a vertical power component on a silicon wafer, including the steps of growing a lightly-doped epitaxial layer of a second conductivity type on the upper surface of a heavily-doped substrate of a first conductivity type, the epitaxial layer having a thickness adapted to withstanding the maximum voltage likely to be applied to the power component during its operation; and delimiting in the wafer an area corresponding to at least one power component by an isolating wall formed by forming a trench through the epitaxial layer and diffusing from this trench a dopant of the first conductivity type of high doping level.

According to an embodiment of the present invention, the trench is formed of neighboring openings sufficiently close to one another for the areas resulting from the diffusion of the dopant of the first conductivity type of high doping level to join.

According to an embodiment of the present invention, the trench is filled with heavily-doped polysilicon.

According to an embodiment of the present invention, parallel isolating walls are formed on either side of each cutting area of the chips of the same wafer.

The present invention also provides a vertical power component formed on a silicon wafer including an epitaxial layer of the second conductivity type of low doping level formed on a substrate of the first conductivity type of high doping level, in which an isolating wall at the periphery of the power component is formed from a trench or holes formed through the epitaxial layer and from diffused regions extending from said trench or said holes.

The foregoing objects, features and advantages of the present invention, will be discussed in detail in the following non-limiting description of specific embodiments in connection with the accompanying drawings.

DETAILED DESCRIPTION

Figure 1:
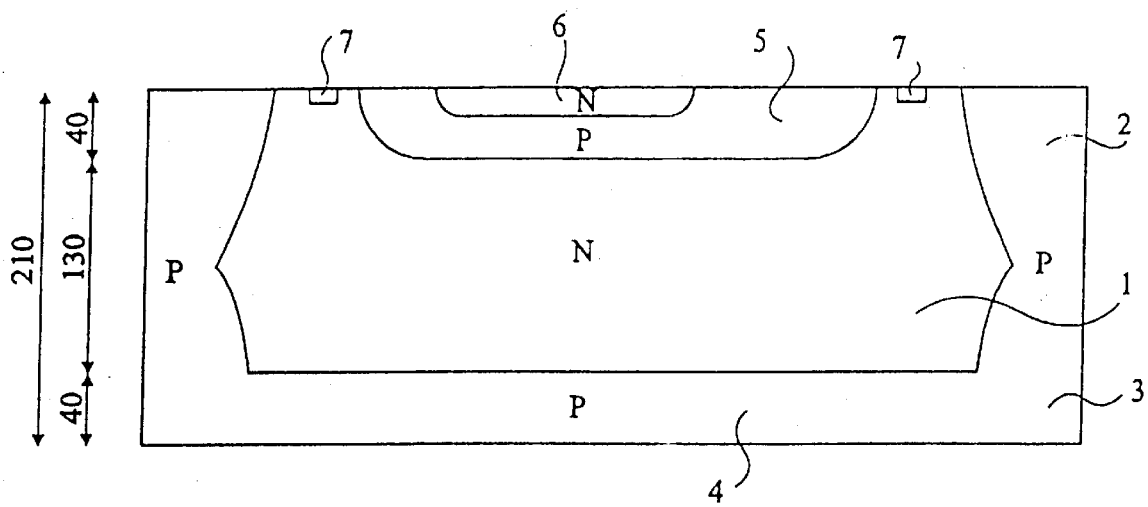
FIG. 1 is a simplified cross-section view of a vertical power component of conventional structure.

According to the present invention, to form a power component, on a relatively heavily-doped P-type substrate 10 is first formed by the epitaxy of a lightly-doped N-type layer 11 intended to form the breakdown voltage layer of a vertical power component, of which the P substrate forms the lower surface anode. Then, to form an isolating wall, the present invention provides forming a trench 13 substantially crossing the thickness of epitaxial layer 11 and surrounding the component, then diffusing a dopant 14 from this trench. For example, the trench will be filled with heavily-doped P-type polysilicon and a thermal diffusion step will be performed. The time required by the diffusion will be extremely short as compared to the time required by the steps of vertical deep diffusion of the isolating walls described in relation with FIG. 1.

According to an alternative of the present invention, the trench is replaced with openings sufficiently close to one another for diffused areas 14 laterally extending from these openings to join and form the isolating wall. The openings may for example have a diameter on the order of 1 to 5 $\mu$m and be distant from one another by 2 to 10 $\mu$m.

It should be noted that a method of forming deep diffusions from the upper surface to form isolating walls would not be compatible with the existence of an epitaxial substrate, since this would cause a new diffusion of the dopant of substrate 10 into epitaxial layer 11, which would result, on the one hand, that the remaining thickness of layer N would be poorly determined and, on the other hand, that the front of the junction between N-type epitaxial layer 11 and P-type substrate 10 would have a very shallow slope and thus that this junction would exhibit poor injection characteristics.

Then, diffusions intended to form a desired component, for example a cathode gate diffusion 5 and cathode and channel stop ring diffusions 6 and 7 will be conventionally formed. Preferably, to improve the quality of the isolating wall, at the same time as P-type diffusion 5 is formed, a diffusion may be performed into areas 16 corresponding to the high portion of the isolating wall, to increase the doping level at the upper surface of the isolating wall.

Figure 2:
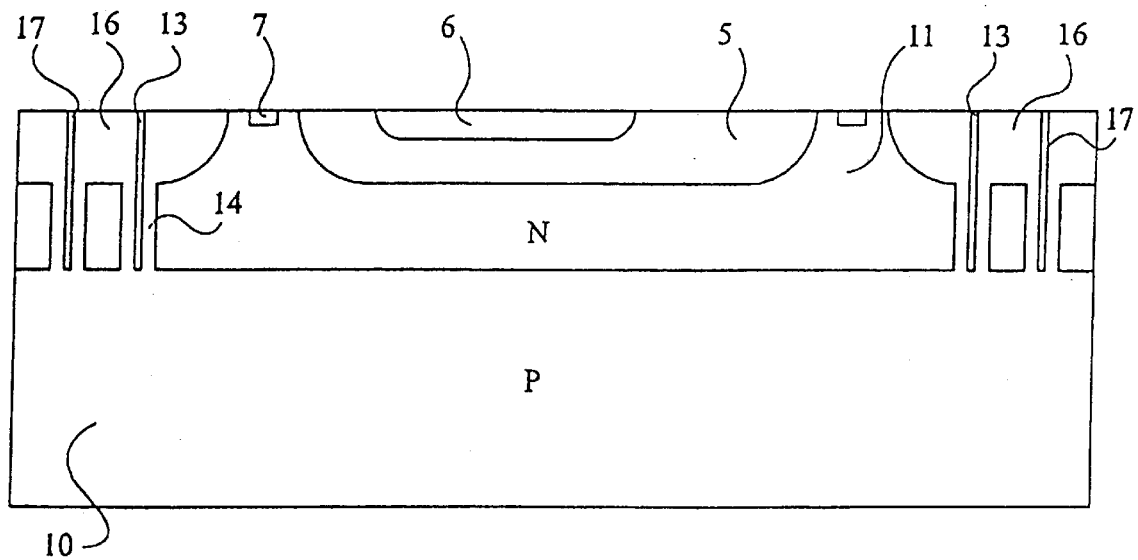
FIG. 2 is a simplified cross-section view of a vertical power component obtained by the method according to the present invention.

Further, a second isolating wall 17 external to the first one has been shown in FIG. 2 as an example. A cutting may be performed between the two isolating walls distant, for example, by 100 $\mu$m, to separate two chips of a wafer.

According to another advantage of the present invention, it should be noted that the isolating walls, in the appended simplified drawings, will have a much smaller lateral extent when formed from trenches or holes rather than from deep diffusions.

Various alternative type of holes and embodiments of the isolating walls will occur to those skilled in the art, some of which are already known in the art and for example described in U.S. patent application Ser. No. 09/426,822, which is incorporated herein by reference Further, a thyristor has been shown in FIGS. 1 and 2 as an example, for the sake of simplicity. Of course, the present invention will also apply to any other vertical-type power component structure, the rear surface of which is of a type opposite to that of a breakdown voltage layer and especially to structures of power transistor and isolated gate bipolar transistor (IGBT) type. In such structures, the present invention enables obtaining a breakdown voltage layer having exactly the desired thickness, independent from technological constraints.

Of course, the present invention is likely to have various alterations, modifications, and improvements which will readily occur to those skilled in the art. For example, a step of lapping the rear surface of the wafers after forming the epitaxial layer on the front surface side may be provided.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a vertical power component on a silicon wafer, comprising the steps of:

growing a lightly-doped epitaxial layer of a second conductivity type on an upper surface of a heavily-doped substrate of a first conductivity type, the lightly-doped epitaxial layer having a thickness sufficient to withstand a maximum voltage applied to the vertical power component during its operation; and delimiting on the silicon wafer an area corresponding to at least one vertical power component by forming an isolating wall by etching a trench through the lightly-doped epitaxial layer, and diffusing from this trench a dopant of the first conductivity type of a high doping level to form the isolating wall.

2. The method of claim 1, wherein the act of delimiting the area comprises etching the trench by etching neighboring openings sufficiently close to one another to be within areas resulting from the diffusing of the dopant from the neighboring openings.

3. The method of claim 1, further comprising an act of filling the trench with heavily-doped polysilicon.

4. The method of claim 1, further comprising an act of forming parallel isolating walls on either side of each of one or more cutting areas of one or more chips of the same wafer.

* * * * *